(12) United States Patent
Chen et al.

(10) Patent No.: US 9,105,440 B2
(45) Date of Patent: Aug. 11, 2015

(54) APPARATUS OF PLURAL CHARGED PARTICLE BEAMS WITH MULTI-AXIS MAGNETIC LENS

(71) Applicant: Hermes-Microvision, Inc., Hsinchu (TW)

(72) Inventors: Zhongwei Chen, San Jose, CA (US); Weiming Ren, San Jose, CA (US); Xuerang Hu, San Jose, CA (US); Xuedong Liu, San Jose, CA (US)

(73) Assignee: HERMES MICROVISION, INC., Hsinchu (TW)

( * ) Notice: Subject to any disclaimer, the term of this patent is extended or adjusted under 35 U.S.C. 154(b) by 0 days.

(21) Appl. No.: 14/468,674

(22) Filed: Aug. 26, 2014

(65) Prior Publication Data

US 2015/0060662 A1 Mar. 5, 2015

Related U.S. Application Data

(60) Provisional application No. 61/872,205, filed on Aug. 30, 2013.

(51) Int. Cl.
*H01J 37/141* (2006.01)
*H01J 37/145* (2006.01)
*H01J 37/28* (2006.01)

(52) U.S. Cl.
CPC ............ *H01J 37/141* (2013.01); *H01J 37/145* (2013.01); *H01J 37/28* (2013.01); *H01J 2237/141* (2013.01); *H01J 2237/1415* (2013.01); *H01J 2237/15* (2013.01); *H01J 2237/281* (2013.01); *H01J 2237/2817* (2013.01)

(58) Field of Classification Search
CPC ......... H01J 37/141; H01J 37/20; H01J 37/28; H01J 2237/04922; H01J 2237/04926; H01J 2237/14–2237/1415; H01J 2237/2611; H01J 2237/2817
See application file for complete search history.

(56) References Cited

U.S. PATENT DOCUMENTS

| 3,715,580 | A * | 2/1973 | Maekawa et al. ............. 250/397 |
| 8,003,953 | B2 | 8/2011 | Chen et al. |
| 8,294,095 | B2 | 10/2012 | Chen et al. |
| 8,445,862 | B2 | 5/2013 | Chen et al. |
| 2012/0145917 | A1* | 6/2012 | Chen et al. .................... 250/398 |

OTHER PUBLICATIONS

U.S. Appl. No. 13/464,261, filed May 4, 2012 Ren et al.

* cited by examiner

*Primary Examiner* — Phillip A Johnston
*Assistant Examiner* — Eliza Osenbaugh-Stewar
(74) *Attorney, Agent, or Firm* — WPAT, PC; Justin King

(57) ABSTRACT

An apparatus of plural charged particle beams with multi-axis magnetic lens is provided to perform multi-functions of observing a specimen surface, such as high-throughput inspection and high-resolution review of interested features thereof and charge-up control for enhancing image contrast and image resolution. In the apparatus, two or more sub-columns are formed and each of the sub-columns performs one of the multi-functions. Basically the sub-columns take normal illumination to get high image resolutions, but one or more may take oblique illuminations to get high image contrasts.

24 Claims, 12 Drawing Sheets

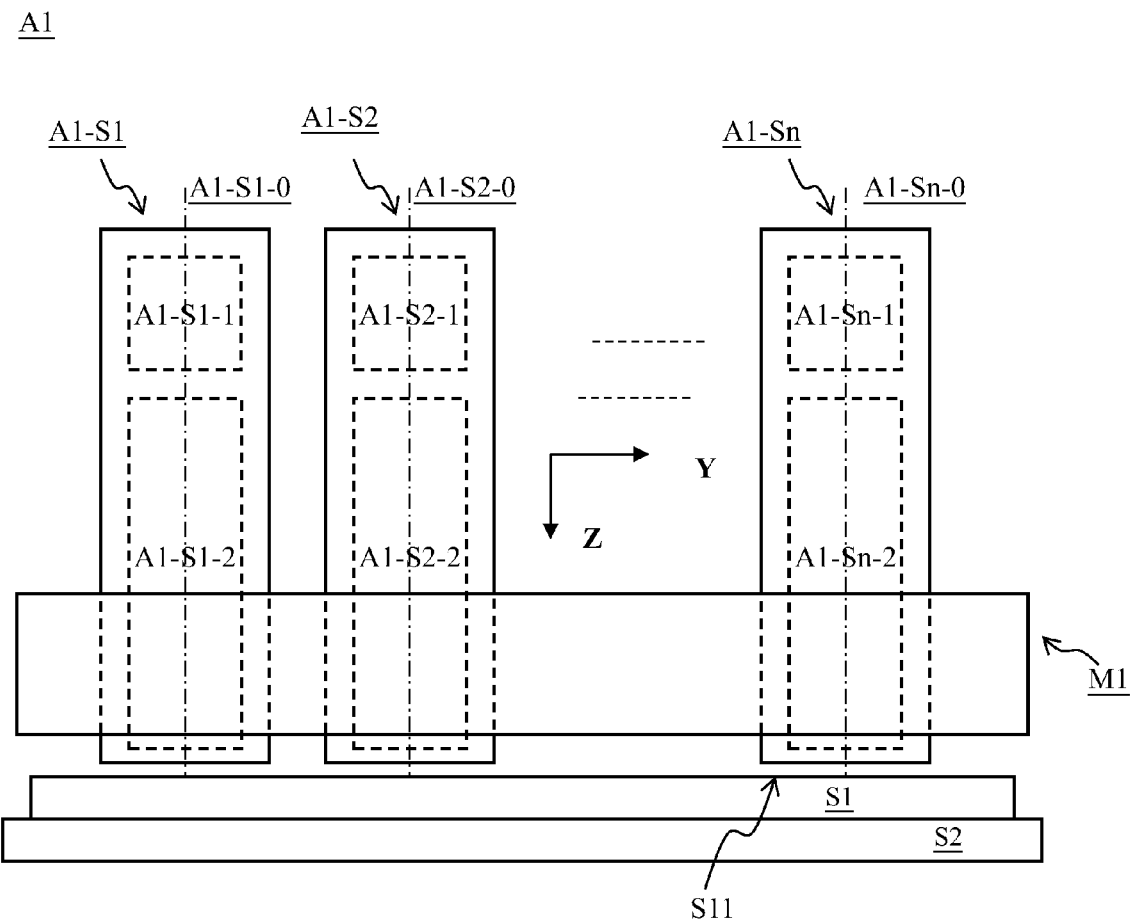
FIG. 3 (Invention)

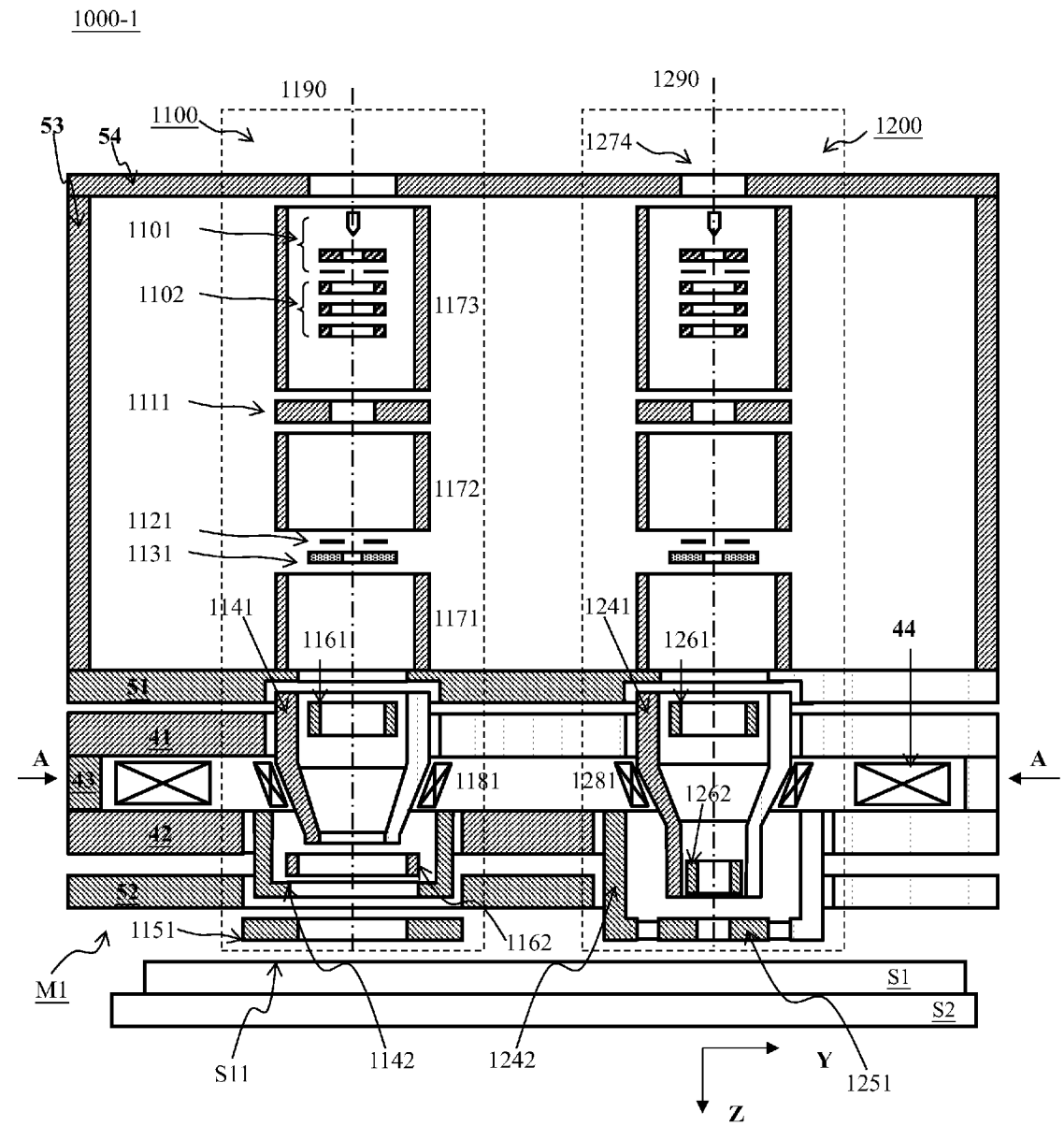
FIG. 4A (Invention)

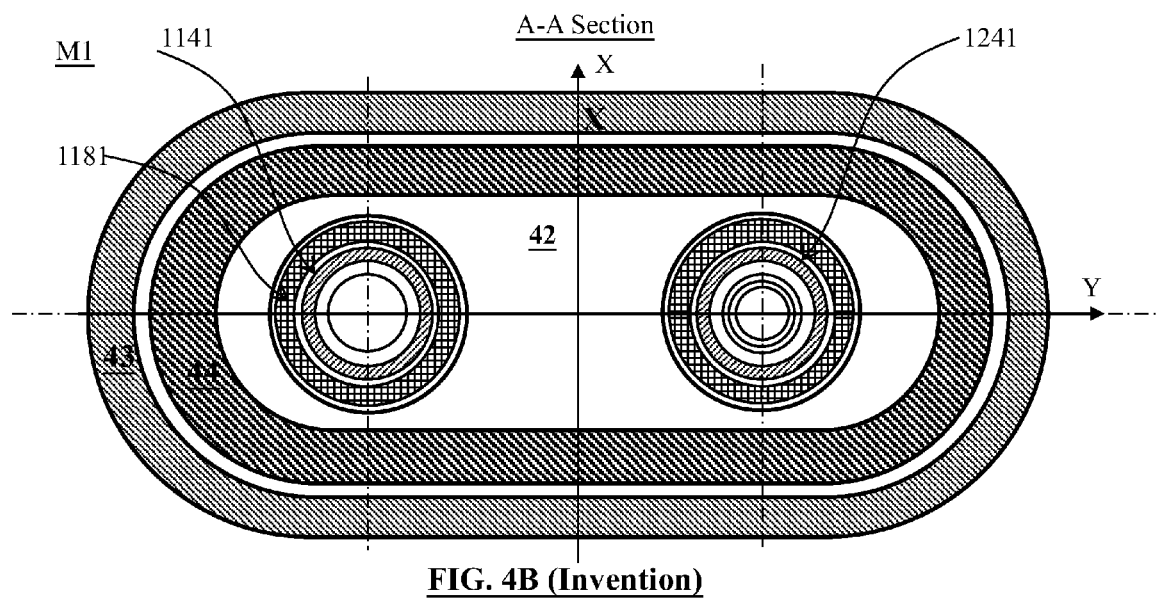
FIG. 4B (Invention)

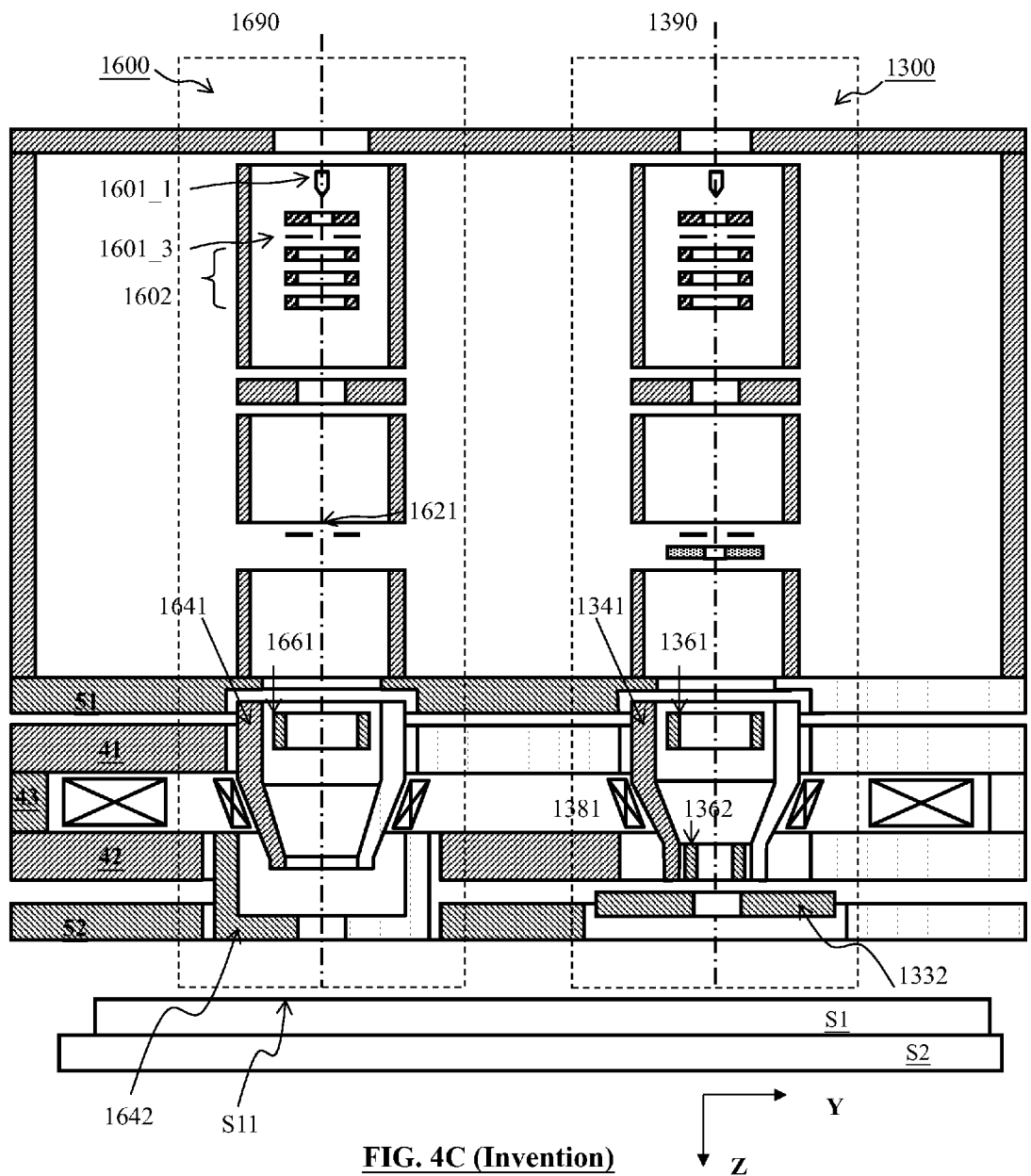
FIG. 4C (Invention)

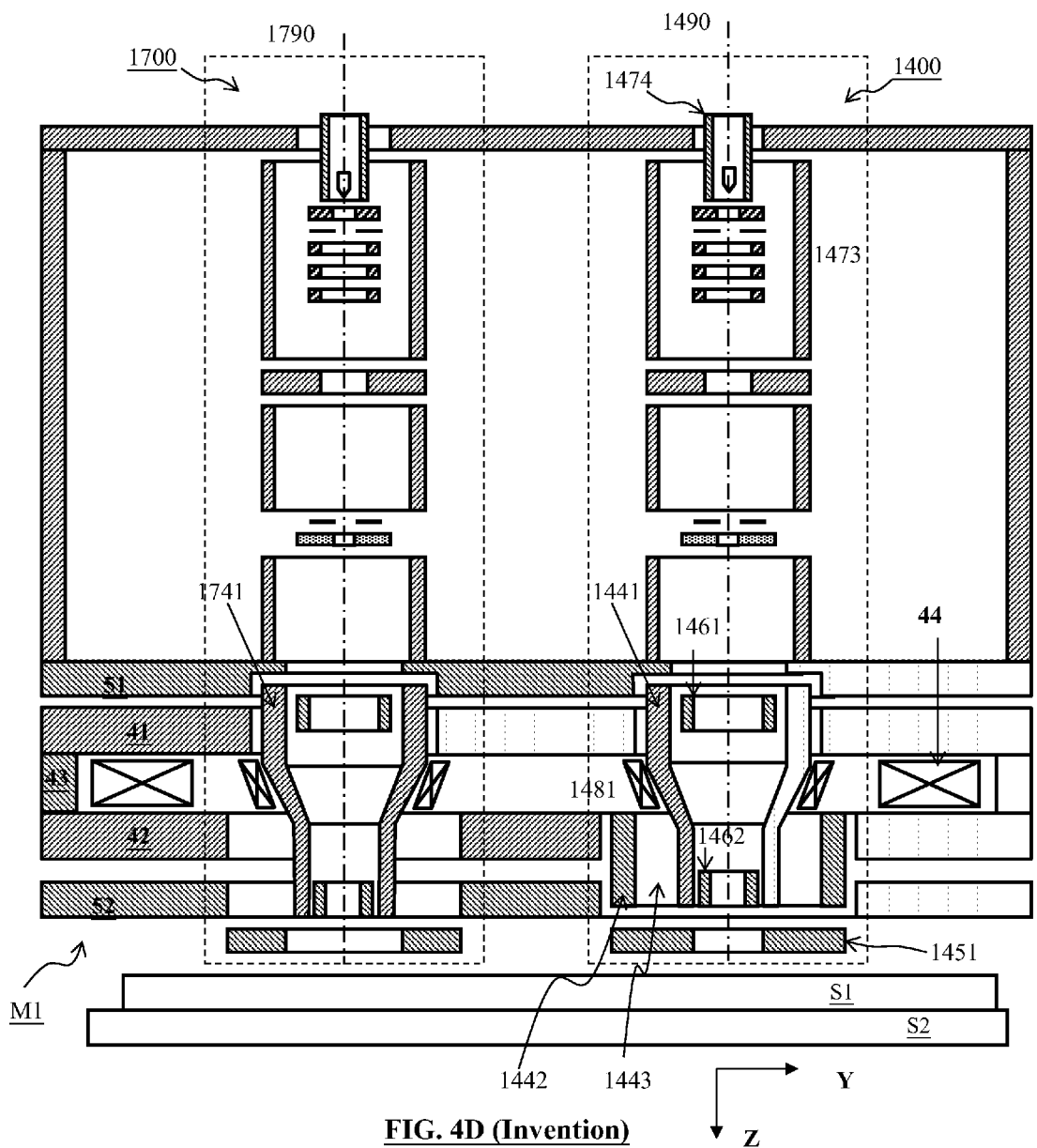
FIG. 4D (Invention)

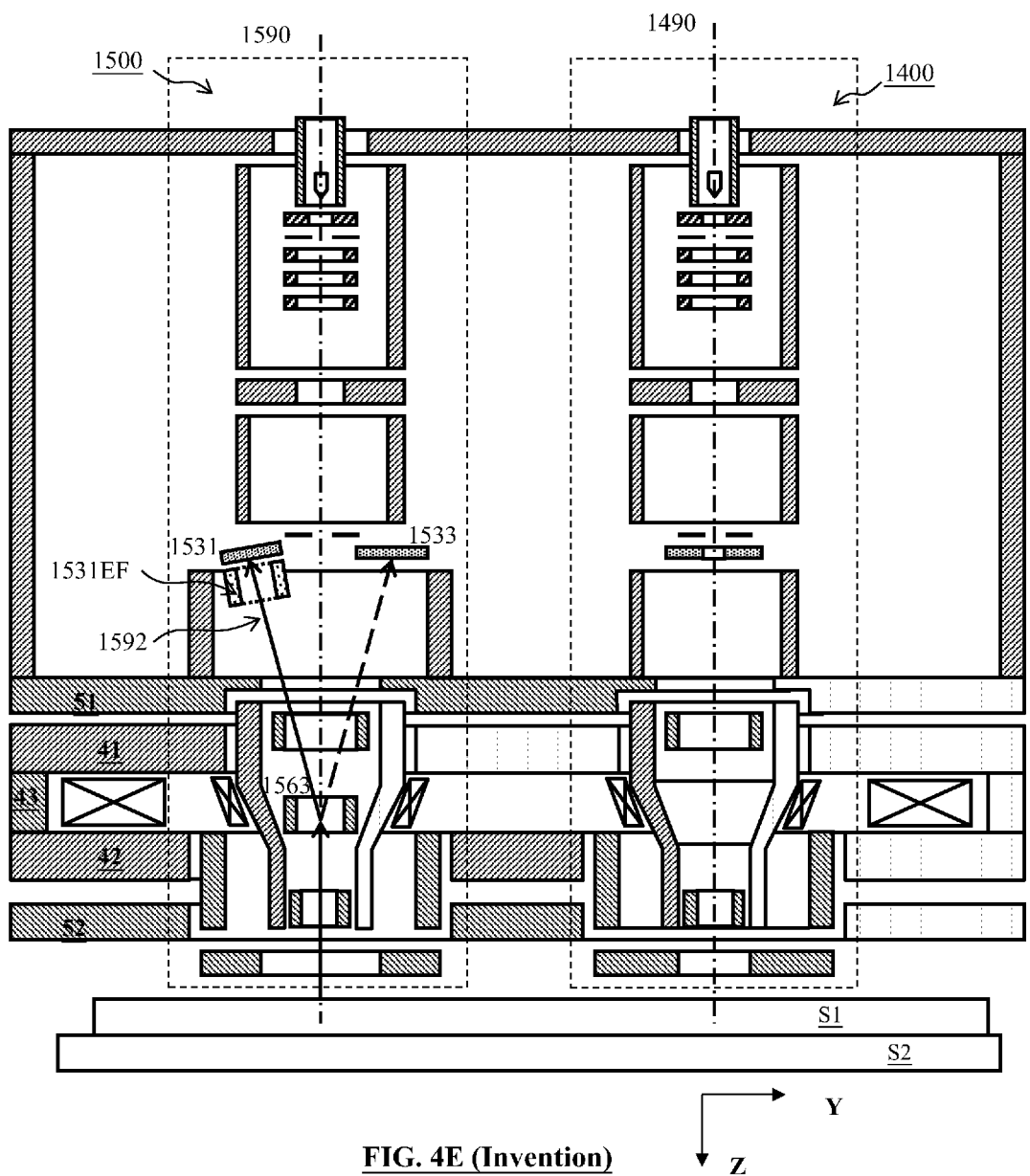
FIG. 4E (Invention)

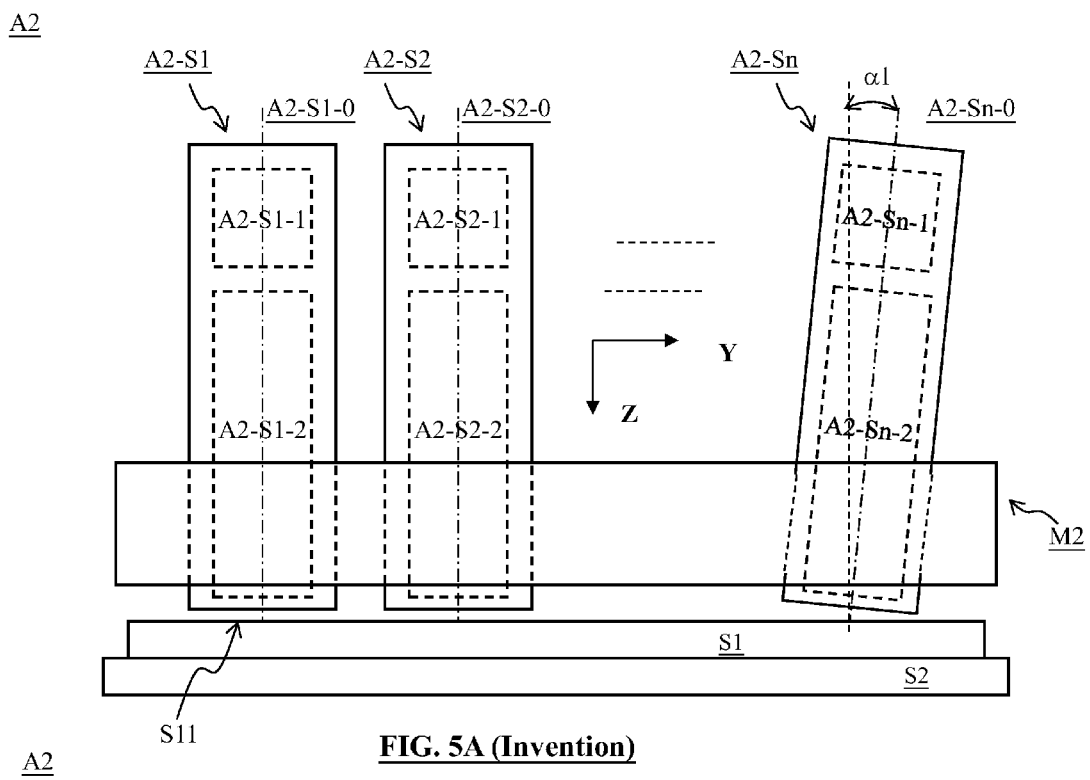
FIG. 5A (Invention)
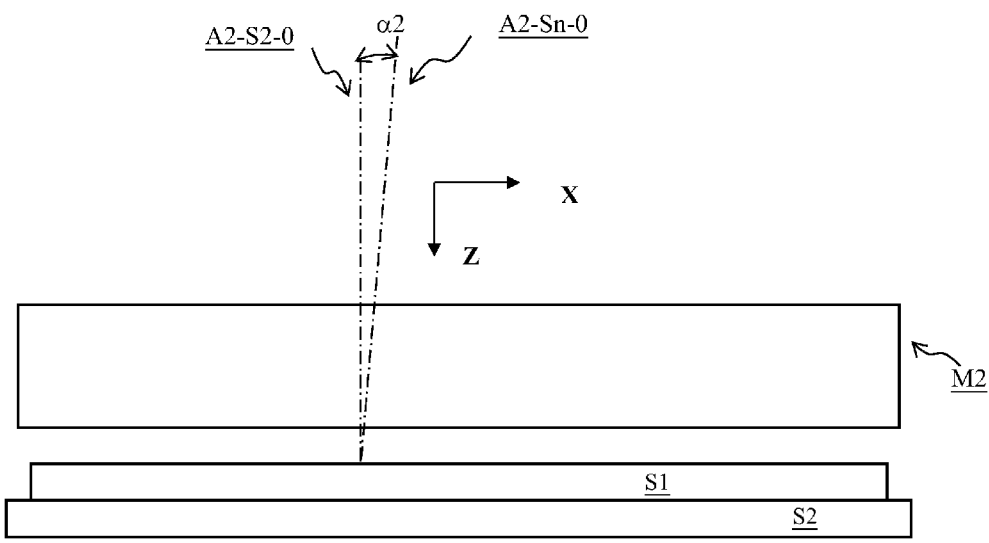
FIG. 5B (Invention)

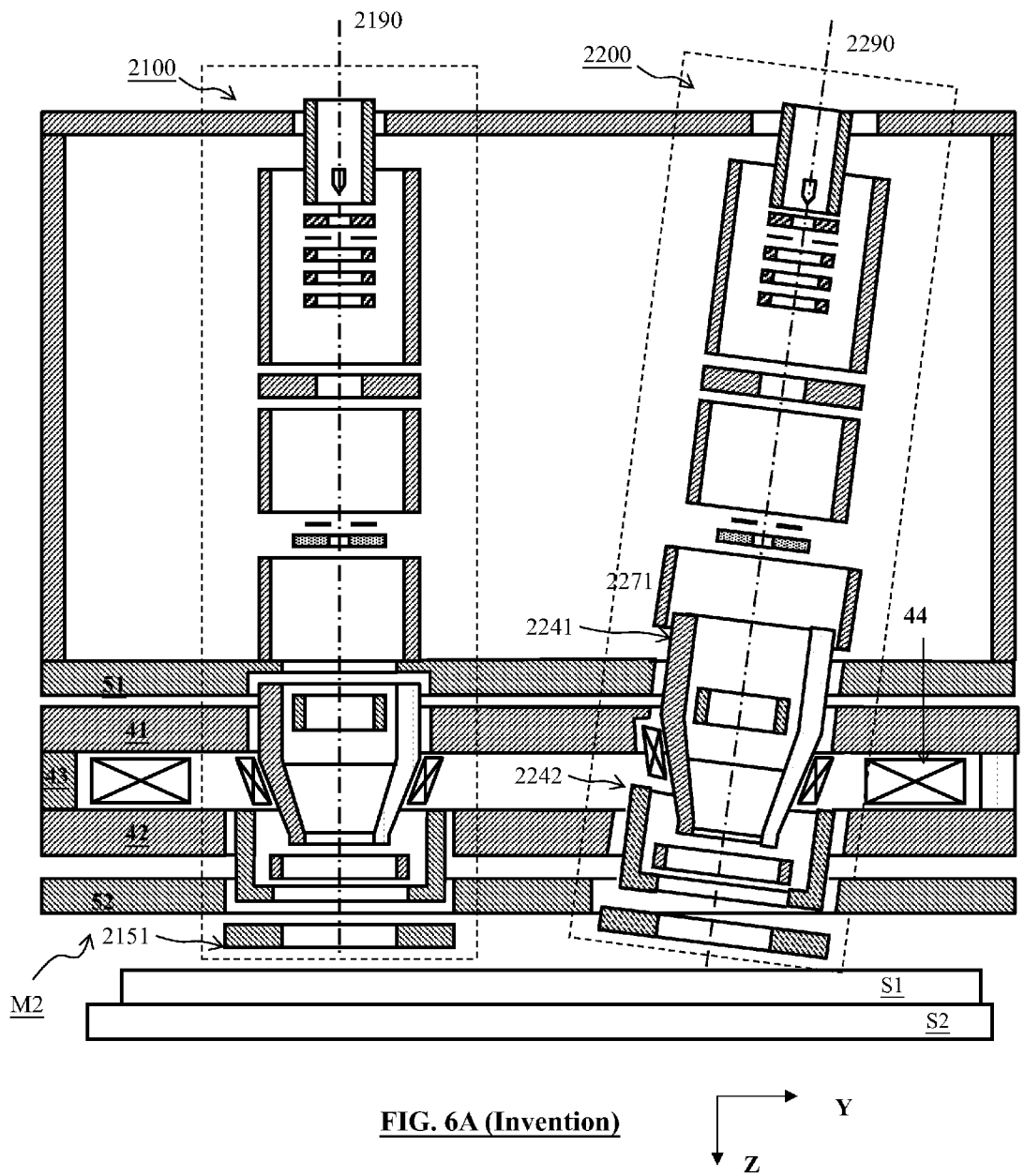
FIG. 6A (Invention)

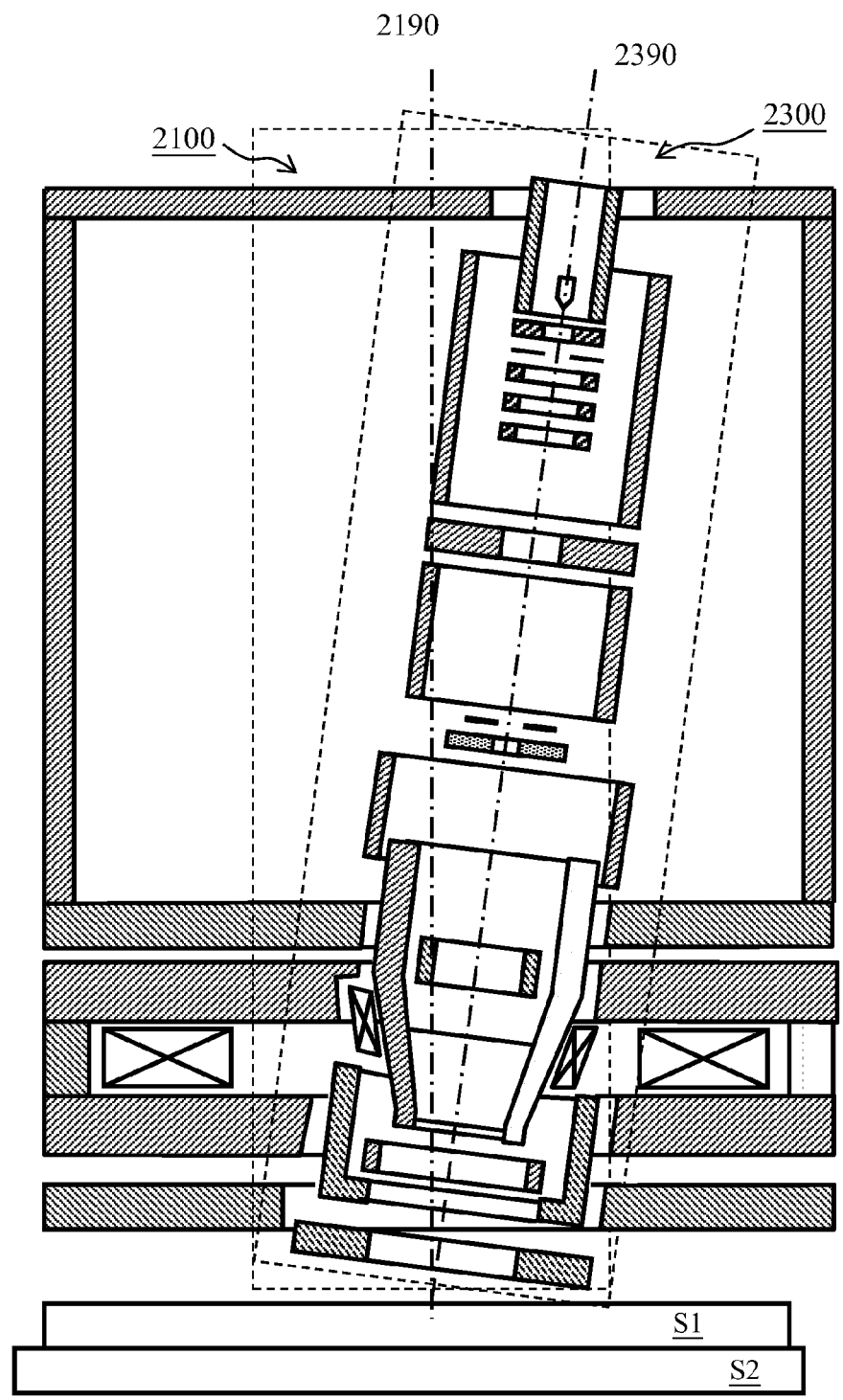
FIG. 6B (Invention)

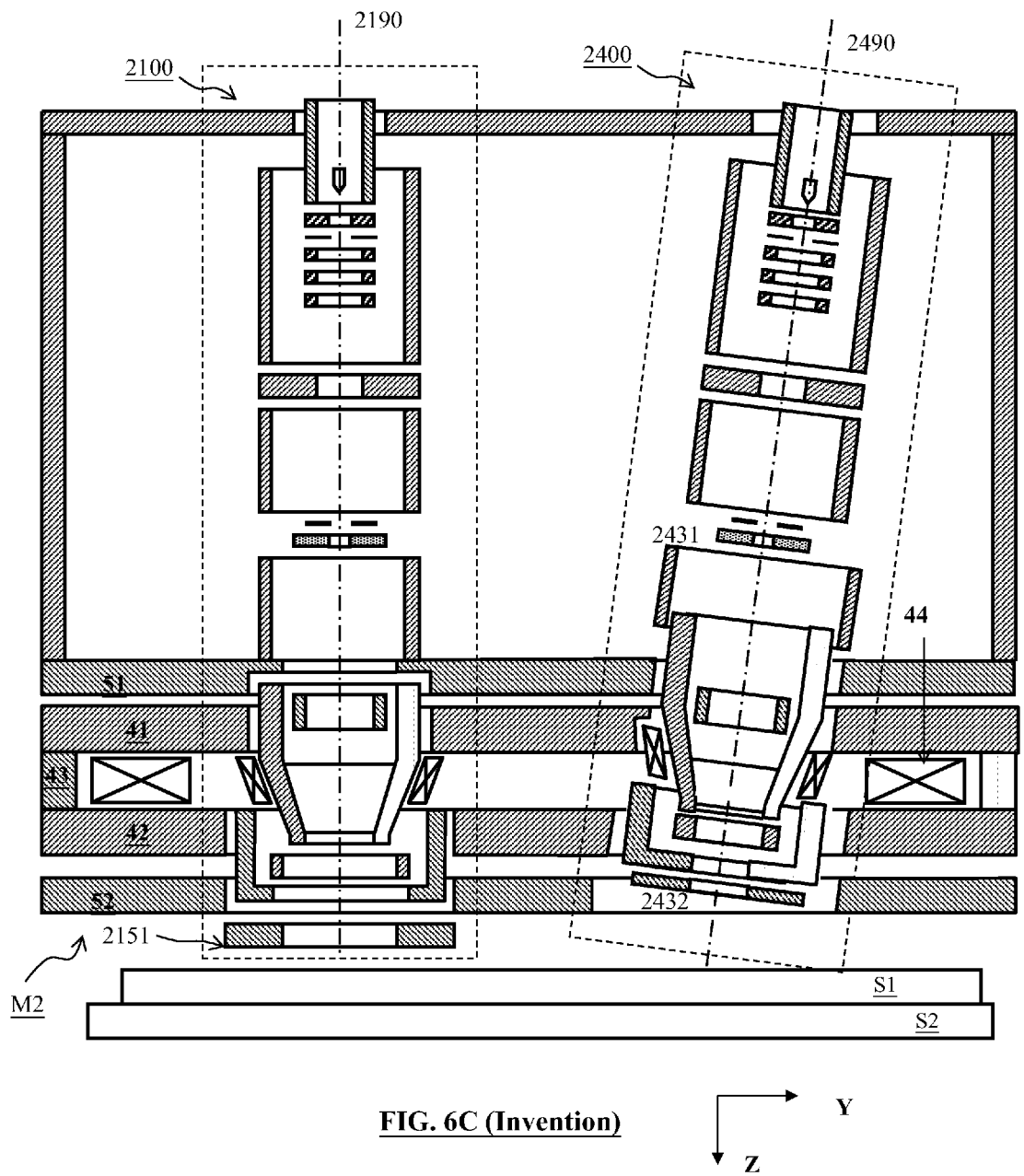
FIG. 6C (Invention)

APPARATUS OF PLURAL CHARGED PARTICLE BEAMS WITH MULTI-AXIS MAGNETIC LENS

CLAIM OF PRIORITY

This application claims the benefit of priority of U.S. provisional application No. 61/872,205 entitled to Zhongwei Chen et al. filed on Aug. 30, 2013 and entitled "APPARATUS OF PLURAL CHARGED PARTICLE BEAMS WITH MULTI-AXIS MAGNETIC LENS", the entire disclosures of which are incorporated herein by reference.

CROSS REFERENCE TO RELATED APPLICATIONS

This application is related to co-pending U.S. application Ser. No. 13/464,261 entitled to Ren et al. filed May 4, 2012 and entitled "MULTI-AXIS MAGNETIC LENS for focusing a plurality of Charged Particle Beams", the entire disclosures of which are incorporated herein by reference.

BACKGROUND OF THE INVENTION

1. Field of the Invention

The present invention relates to a multi-axis magnetic lens and variants thereof which can focus a plurality of charged particle beams simultaneously and individually. More particularly, it relates to an apparatus of charged particle beam, which can perform multi-functions for observing a specimen surface simultaneously or in a programmed series.

2. Description of the Prior Art

For manufacturing semiconductor IC chips, pattern defects and/or uninvited particles (residuals) occur on wafer/mask surfaces during fabrication processes, which reduce the yield to a great degree. As smaller and smaller critical dimensions of patterns on wafer/mask are required, electron beam (e-beam) tools for defect/particle inspection and defect/particle review have been widely used for the yield management due to their higher imaging resolutions than the corresponding optical tools.

The defect/particle inspection and the defect/particle review are much different in requirements for throughput (which determines how many defects can be detected out in unit time) and imaging resolution (which determines the minimum detectable defect size). The e-beam tools fundamentally work on the principle of scanning electron microscope (SEM). Due to the geometric aberrations and electron interactions (Coulomb effect), it is very difficult or even impossible to realize both the inspection and the review in a single e-beam tool. The state-of-art is that defect/particle inspection and defect/particle review are respectively performed by individual tools; i.e. each tool can only perform a specific function. A tool for defect/particle inspection at first detects pattern defects and process-induced particles, and then feeds the inspection results to a tool for defect/particle review. The tool for defect/particle review shows the defects/particles with an imaging resolution higher than that of the tool for defect/particle inspection in order to provide information for further analyzing the root causes of deflects/particles. Consequently, to monitor the quality of a wafer or a mask, the wafer or the mask has to be transferred between the tools for defect/particle inspection and defect/particle review one or more times. The one or more transfers therebetween reduce the monitoring speed and increase the monitoring cost.

To solve the foregoing problem, a promising solution is to incorporate the tools for defect/particle inspection and defect/particle review into one apparatus. In this way, the transfers between different tools will be within a common vacuum space and a limited distance range. Many procedures of moving and protecting wafers/masks for the transfers will be removed. Consequently, compared with the conventional way for the yield management, a single apparatus with multi-functions can provide a much higher throughput with a much lower cost.

Each of the foregoing e-beam tools basically comprises an electron gun unit providing a single electron beam and an imaging system comprising a single-axis magnetic objective lens. If simply putting the tools into one apparatus, the spatial interval between every two adjacent tools must be large enough to physically accommodate two single-axis magnetic objective lenses thereof. Hence, the number of tools available for a wafer or a mask will not be sufficient for mass production, and the transfer distances among the tools will be large. Another way is using a multi-axis magnetic lens to replace the single-axis magnetic objective lenses of all the tools, which can reduce the spatial interval by 50%, thereby almost doubling the number of the available tools.

The idea of using a multi-axis magnetic lens to separately focus a plurality of electron beams parallel to each other was proposed as early as in 1973 by Maekawa et al. in U.S. Pat. No. 3,715,580. FIGS. 1A and 1B respectively illustrate the configuration and the magnetic field distribution of the multi-axis magnetic lens. The multi-axis magnetic lens comprises one common exciting coil 44, one yoke 43, and two parallel magnetic conductor plates 41 and 42 with a plurality of through holes in pairs. When an electric current is exerted into the coil 44, between each pair of coaxial holes, a magnetic axisymmetric field (round lens field) will be generated along the coincident central axes thereof (such as 31 in FIG. 1B), and consequently one magnetic sub-lens such as 30 is formed therebetween. The two magnetic conductor plates 41 and 42 form pole pieces for magnetic sub-lenses 10, 20 and 30 which respectively focus the corresponding charged particle beams 1, 2 and 3.

As shown in FIG. 1B, in terms of Fourier analysis, the magnetic field of each magnetic sub-lens comprises not only the axisymmetric component or called as round-lens field, but also a lot of non-axisymmetric transverse field components or called as high order harmonics, such as dipole field and quadrupole field. Only the round-lens field is necessary for focusing an electron beam, and the other components are undesired due to generating additional aberrations. To compensate the influence of each high order harmonic, at least one additional element generating the same type field is required. However, the additional element obviously increases the volume and the complication of the multi-axis magnetic lens.

Chen et al propose one method in U.S. Pat. Nos. 8,003,953, 8,294,095 and 8,445,862 and the cross reference, which can fundamentally mitigate or even eliminate the high order harmonics per se. As shown in FIG. 2A, the method comprises three steps. The first step is inserting a magnetic ring (such as 12) inside each hole of every magnetic sub-lens (such as 10) with a radial gap (such as 14). The radial gap can be vacuum or filled of non-magnetic or weakly-magnetic material. The radial gap weakens the non-axisymmetric distribution of magnetic scalar potential inside the magnetic ring, and as a result reduces high order harmonics. The second step is extending one of the two magnetic rings of each sub-lens inside the other so as to further reduce the high order harmonics inside the magnetic sub-lens. If the extended magnetic ring fully goes through the hole where the other magnetic ring is inserted, in some cases the other magnetic ring can even be removed for simplification in manufacturing, such as shown in FIG. 2C. The third step is using two magnetic shielding plates respectively above and below the two parallel magnetic conductor plates so as to reduce the high order harmonics outside each magnetic sub-lens.

For each magnetic sub-lens, the magnetic rings inside the upper and lower holes function as pole-pieces and the magnetic field is formed through the magnetic-circuit gap (such as 15 in FIG. 2A) therebetween. The magnetic field distribution along the optical axis (such as 11) of the magnetic sub-lens is determined by the magnetic-circuit gap. Due to using the magnetic rings, the magnetic-circuit gap can be freely formed in any shape and any orientation so as to generate a desired magnetic field distribution for a certain application. In FIG. 2A, each magnetic sub-lens has an axial magnetic-circuit gap and can be used as non-immersion magnetic objective sub-lens or magnetic condenser sub-lens. In FIGS. 2B and 2C, the magnetic sub-lenses have radial magnetic-circuit gaps and can be used as immersion magnetic objective sub-lenses.

The foregoing multi-axis magnetic lenses proposed by Chen et al. are mainly used to an apparatus performing a single function required for observing a specimen surface with high throughput, such as defect/particle inspection or defect/particle review of a wafer or a mask. As mentioned at the beginning, an apparatus with multi-functions required for observing a specimen is needed especially for the yield management in semiconductor manufacturing. Accordingly, this invention will propose such an apparatus which can perform a variety of independent functions required for observing a specimen surface simultaneously or in a programmed series so as to realize an all-round observation of the specimen surface with both a high throughput and a low cost.

SUMMARY OF THE INVENTION

The object of this invention is to provide an apparatus of charged particle beam with multi-functions for observing a specimen surface, such as both high-throughput inspection and high-resolution review of interested features thereof. The apparatus basically employs a plurality of charged particle beams and a multi-axis magnetic objective lens to form more than one sub-columns respectively performing one of the multi-functions. For example, the apparatus can perform the functions of defect/particle inspection and defect/particle review for yield management of wafer/mask in semiconductor manufacturing. Compared with the conventional way for the yield management, wherein each of the multi-functions is realized in an individual single-function apparatus, a single apparatus with multi-functions can provide a much higher throughput with a much lower cost.

Accordingly, the invention therefore provides one embodiment of the apparatus of plural charged particle beams. The apparatus comprises a specimen stage for sustaining a specimen thereon, and multiple sub-columns placed above an observed surface of the specimen and respectively performing one of multiple functions for observing the observed surface. A first function of the multiple functions is high-throughput inspection of interested features on the observed surface, and a second function of the multiple functions is high-resolution review of the interested features on the observed surface.

Each of the multiple sub-columns comprises a gun unit and an imaging system. The gun unit comprises a charged particle source and a condenser lens to provide a primary charged particle beam along an optical axis of the sub-column. The imaging system comprises a beam-limit aperture, an objective lens, a deflection scanning device and a first charged-particle detector. The beam-limit aperture and the objective lens are aligned with the optical axis, the beam-limit aperture limits a current of the primary charged particle beam to a desired value, and the objective lens focuses the primary charged particle beam onto the observed surface. The first charged-particle detector detects secondary charged particles emitted from the observed surface where the primary charged particle beam impinges, and the deflection scanning device deflects the primary charged particle beam to scan the observed surface so that an image of the observed surface can be obtained. The objective lens comprises a magnetic objective lens. The magnetic objective lenses of the multiple sub-columns are formed by a multi-axis magnetic objective lens.

The multi-axis magnetic objective lens comprises an upper magnetic conductor plate with multiple upper through holes, a lower magnetic conductor plate with multiple lower through round holes, multiple upper magnetic round rings and a common excitation coil. Both upper and lower magnetic conductor plates are parallel with each other. Each of the multiple upper through holes is aligned with one of the multiple lower through round holes, and both are aligned with the optical axis of one of the multiple sub-columns and form a pair of through holes. The multiple upper magnetic round rings are respectively inside and aligned with the upper through holes of the pairs of through holes with first radial gaps therebetween, and extend downward through inside lower through round holes of that pairs of through holes to form first non-magnetic gaps therebetween. The first radial gaps can be vacuum or filled of non-magnetic or weakly-magnetic material. The common excitation coil is located between the upper and lower magnetic conductor plates to provide a common magnetic flux. Multiple magnetic objective sub-lenses are therefore formed and each is configured by one of the multiple pairs of through holes and the corresponding upper magnetic round ring therein. The first non-magnetic gap inside each magnetic objective sub-lens performs as a magnetic-circuit gap thereof. A magnetic field of each magnetic objective sub-lens is therefore generated by the common magnetic flux leaking through the magnetic-circuit gap thereof. Each of magnetic objective lenses therefore is one of the multiple magnetic objective sub-lenses, and the magnetic objective sub-lenses inside the sub-columns which perform different functions are different in geometric shape.

Each charged particle source can be an electron source of field emission. The primary charged particle beam is therefore a primary electron beam formed by electrons emitted from the electron source, and the secondary charged particles are secondary electrons (energy≤50 eV) and backscattered electrons both generated by the primary electron beam from the observed specimen surface. Inside one of the sub-columns, the magnetic objective sub-lens can further comprise a first sub-coil winding around the upper magnetic round ring so that the magnetic field of said magnetic objective sub-lens can be adjusted individually. The imaging system inside each sub-column can further comprise a control electrode which is below the upper magnetic round ring and aligned with the optical axis so as to control an electrostatic field on the observed surface. For one of sub-columns, the control electrode can also function as a second signal-electrons detector to detect the backscattered electrons with large emission angles.

Inside one of the sub-columns, the magnetic objective sub-lens can further comprise a lower magnetic round ring inside and aligned with the lower round hole with a second radial gap. The lower magnetic round ring encircles the upper magnetic round ring to form a second non-magnetic gap therebetween performing the magnetic-circuit gap of the magnetic objective sub-lens. The second radial gap can be vacuum or filled of non-magnetic or weakly-magnetic material. The optical axis of the sub-column can be oblique with respect to the normal of the observed surface. Inside the sub-column, the control electrode can also function as a third signal-electrons detector to detect the backscattered electrons with large emission angles. In this case the optical axis of the sub-column can also be oblique with respect to the normal of the observed surface.

Inside the foregoing sub-column, the second non-magnetic gap can be so shaped that the magnetic field of the magnetic objective sub-lens deeply immerses the observed surface. The first charged-particle detector can be placed off the optical axis of the sub-column. In this case, the sub-column can further comprise an energy filter and a Wien filter. The energy filter is placed in front of the detective surface of first charged-particle detector so as to make the secondary charged particles with energies higher than a desired value to be detected by the first charged-particle detector. The Wien filter deflects the secondary charged particles to enter the energy filter with desired incident angles while not deflecting the primary electron beam.

The apparatus of plural charged particle beams can further comprise one charge-up-control sub-column to especially perform the charge-up control function for the observed surface so as to enhance image contrast or resolution when performing the first function and/or the second function. The charge-up-control sub-column comprises a charge-up-control gun unit, and a charge-up-control imaging system. The charge-up-control gun unit comprises a charge-up-control charged particle source and a charge-up-control condenser lens to provide a charge-up-control primary charged particle beam along an optical axis of the charge-up-control sub-column. The charge-up-control imaging system comprises a charge-up-control beam-limit aperture and a charge-up-control magnetic objective lens both aligned with the optical axis of the charge-up-control sub-column to focus the charge-up-control primary charged particle beam to illuminate the observed surface. The charge-up-control magnetic objective lens is formed by one of the magnetic objective sub-lenses of the multi-axis magnetic objective lens and a second sub-coil. The second sub-coil is winded around the upper magnetic round ring of the magnetic objective sub-lens so that a magnetic field thereof can be adjusted individually. The charge-up-control imaging system can further comprise a charge-up-control deflection scanning device which deflects the charge-up-control primary charged particle beam to scan the observed surface. The magnetic objective sub-lens can further comprise a lower magnetic round ring which is inside and aligned with the lower round hole with a third radial gap and encircles the upper magnetic round ring to form a third non-magnetic gap therebetween performing the magnetic-circuit gap of the magnetic objective sub-lens.

The present invention also provides a method to configure an apparatus with multiple functions for observing a surface of a specimen. The method comprises steps of providing a stage to sustain the specimen, and providing a plurality of charged particle beams and a multi-axis magnetic objective lens to form multiple sub-columns respectively facing the surface of the specimen and performing one of the multiple functions. A first function of the multiple functions is high-throughput inspection of interested features on the surface, and a second function of the multiple functions is high-resolution review of the interested features on the surface. The multi-axis magnetic objective lens comprises a pair of parallel magnetic conductor plates with multiple through holes in pairs, a plurality of magnetic round rings in pairs respectively inside the multiple pairs of through holes with radial gaps and forming magnetic circuit gaps therebetween, a plurality of sub-coils each winding around one magnetic round ring of one of the pairs of magnetic round rings and a common excitation coil located between the pair of parallel magnetic conductor plates. The multi-axis magnetic objective lens therefore forms multiple magnetic objective sub-lenses which are individually adjustable and function as magnetic objective lenses of the multiple sub-columns. The magnetic objective sub-lenses inside the sub-columns which perform different functions are different in geometric shape. The radial gaps can be vacuum or filled of non-magnetic or weakly-magnetic material.

For the method, one of the multiple sub-columns can employ normal illumination. Furthermore, one of the multiple sub-columns can employ an oblique illumination. The method can further provide a charge-up-control charged particle beam to form a charge-up-control sub-column with the multi-axis magnetic objective lens. The charge-up-control sub-column performs the charge-up control function for the surface so as to enhance image contrast or resolution when performing the first function and the second function. The multiple sub-columns can work simultaneously or in a programmed series.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which:

FIG. 3 is a schematic illustration of one apparatus with multi-functions for observing the surface of a specimen in accordance with one embodiment of the present invention.

FIGS. 4A-4E are schematic illustrations of embodiments of sub-columns in the apparatus shown in FIG. 3.

FIG. 5A is a schematic illustration of one apparatus with multi-functions for observing the surface of a specimen in accordance with another embodiment of the present invention.

FIG. 5B is a schematic illustration of one apparatus with multi-functions for observing the surface of a specimen in accordance with another embodiment of the present invention.

FIGS. 6A and 6C are respectively a schematic illustration of one embodiment of sub-columns in the apparatus shown in FIG. 5A.

FIG. 6B is a schematic illustration of one embodiment of sub-columns in the apparatus shown in FIG. 5B.

DETAILED DESCRIPTION OF EXAMPLE EMBODIMENTS

Figure 1A:
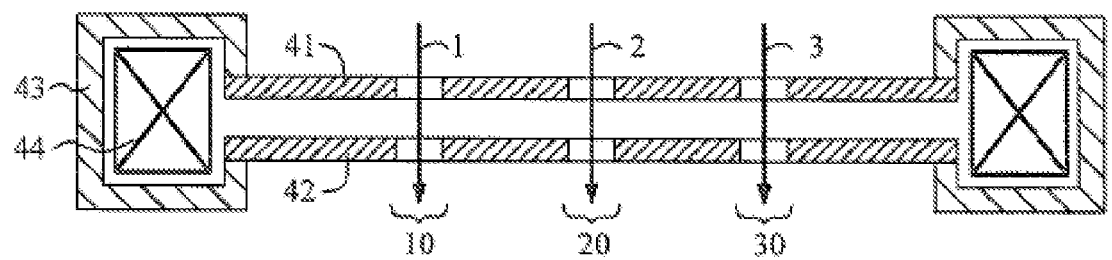
FIGS. 1A and 1B are schematic illustrations of the configuration and magnetic flux distribution of one multi-axis magnetic lens of the primitive type.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In all the drawings, X, Y and Z axe form the Cartesian coordinate. The observed surface of a specimen is perpendicular to Z axis.

In this invention, "axial" means "in the optical axis direction of a lens or a sub-lens", while "radial" means "in a direction perpendicular to the optical axis of a lens or a sub-lens".

Figure 1B:
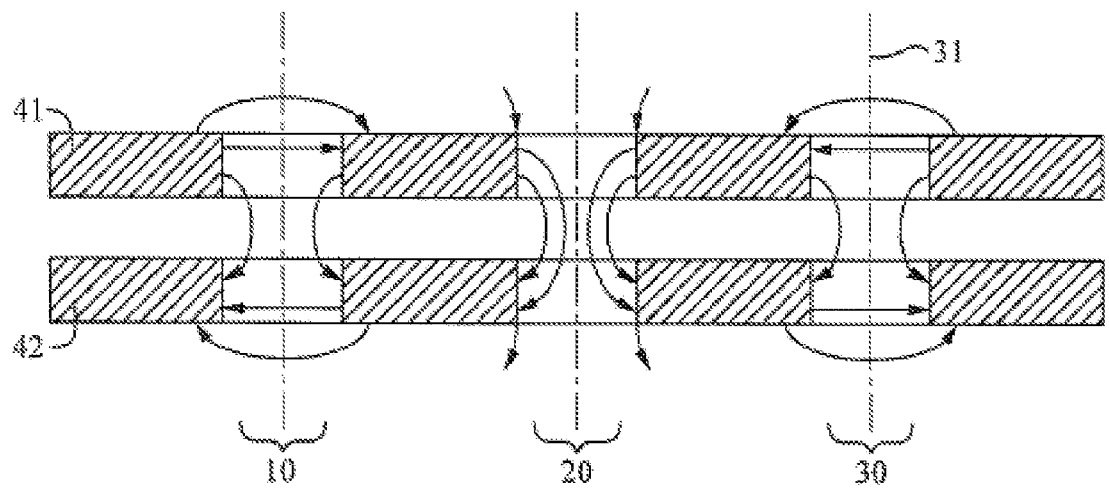
Figure 2A:
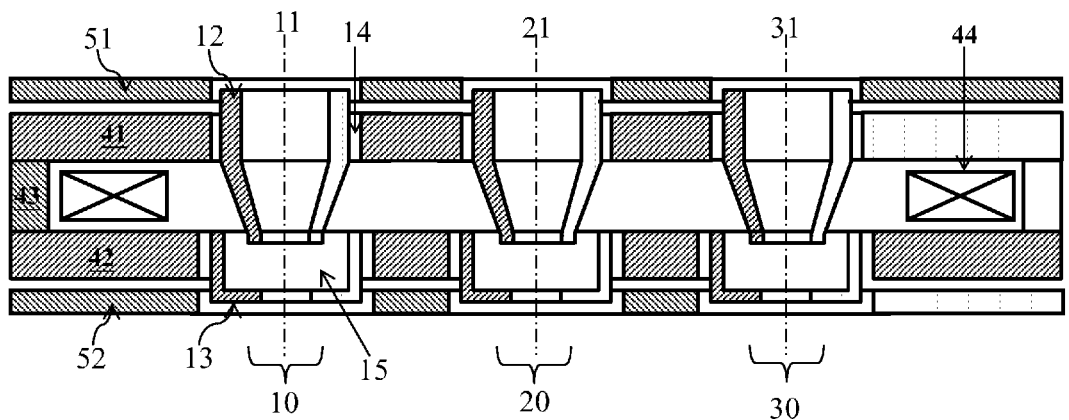
FIGS. 2A-2C are schematic illustrations of configurations of multi-axis magnetic lenses of three improved types.
Figure 2B:
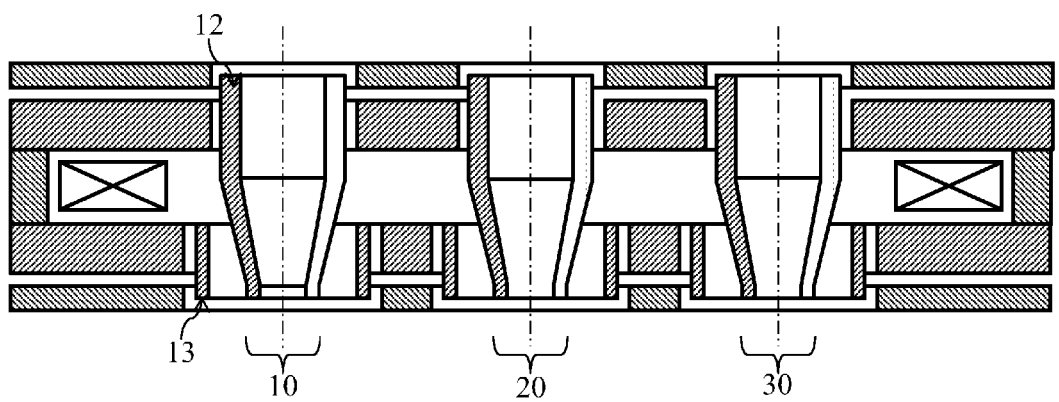
Figure 2C:
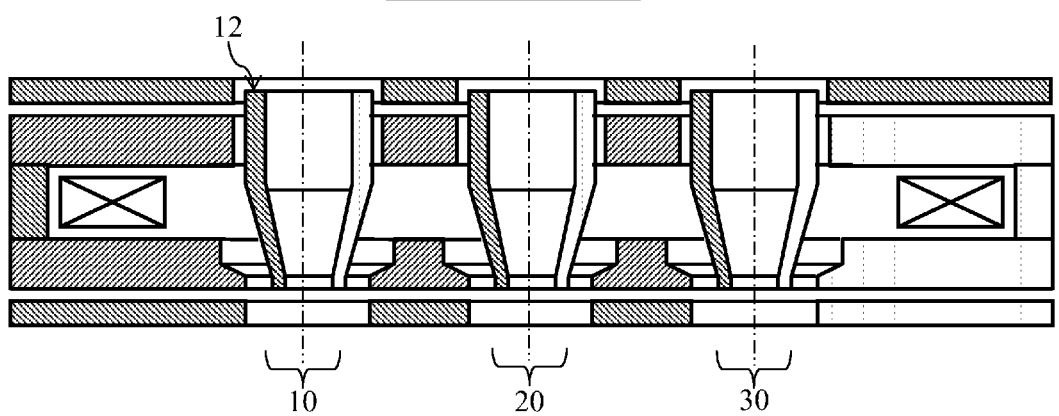

In this invention, every multi-axis magnetic lens has a basic configuration similar to the conventional multi-axis magnetic lens shown in FIGS. 1A and 1B. Accordingly, all terms relate to through holes mean openings or holes penetrated through one plate. For each magnetic sub-lens, upper and lower through holes respectively refer to the through holes in the upper and lower magnetic conductor plates, and upper and lower pole-pieces respectively refer to the pole-pieces originally belong to the upper and lower through holes.

In this invention, "weakly-magnetic material" in a multi-axis magnetic lens means that permeability of the material is much smaller than that of the upper and lower magnetic conductor plates thereof.

In this invention, "magnetic-circuit gap" in a magnetic lens or sub-lens means that the magnetic-circuit gap is the main route through which the magnetic field of said magnetic lens or sub-lens is leaked to distribute along the optical axis thereof.

In the following drawings some units which are necessary for a charged-particle beam apparatus and not special features for the present invention, such as beam-blanking and vacuum means, are not shown.

The object of this invention is to provide an apparatus of charged particle beam with multi-functions required for observing a specimen surface. The multi-functions comprise at least both high-throughput inspection and high-resolution review of interested features on the surface of the specimen. The apparatus employs a plurality of electron beams and a multi-axis magnetic objective lens to form more than one sub-columns respectively performing one of the multi-functions. Some of the sub-columns may perform same or similar functions.

Accordingly, this invention shows two kinds of such an apparatus in FIG. 3 and FIGS. 5A and 5B. The apparatus A1 shown in FIG. 3 refers to the first kind, which comprises multiple sub-columns (such as A1-S1, A1-S2 to A1-Sn) and all of the sub-columns employ normal illumination for observation with high image resolution. It is well known that a sub-column generates smaller geometrical aberrations in normal illumination than in an oblique illumination. The apparatus A2 shown in FIGS. 5A and 5B refer to the second kind, which comprises multiple sub-columns (such as A2-S1, A2-S2 to A2-Sn) and at least one (such as A2-Sn) of the sub-columns employs an oblique illumination for observation with high image contrast. For observing certain features on the surface of a specimen, such as particle or a defect in a trench of a patterned wafer, an oblique illumination is needed to obtain an image with high contrast. For the apparatus A1 and the apparatus A2, every sub-column thereof can work individually; therefore all the sub-columns can work simultaneously or in a programmed series.

In apparatus A1, the optical axis of each sub-column, such A1-S1-0 of the sub-column A1-S1, is perpendicular to the observed surface of the specimen S1 sustained by the specimen stage S2. At least one of the sub-columns can perform high-throughput inspection of interested features on the surface of the specimen, and at least one of the sub-columns can conduct high-resolution review of interested features on the surface of the specimen. A conventional single-beam tool for observing a specimen surface usually comprises a flood gun to perform the auxiliary function named as charge-up control. It is used to control the charge-up situation of the local area of the specimen surface before or after an observation so as to get a better image contrast or resolution. Therefore, it is preferred that at least one of the sub-columns can be specially configured to perform this auxiliary function (charge-up-control function).

Each sub-column works on the fundamental of scanning electron microscopy and thereby basically comprising an electron gun unit (such as A1-S1-1 in A1-S1) and an imaging system (such as A1-S1-2 in A1-S1) both aligned with the optical axis (such as A1-S1-0 in A1-S1) thereof. The electron gun unit comprises an electron source and a condenser lens so as to provide an appropriate primary electron beam (PE beam) for the imaging system. The imaging system comprises a beam-limit aperture, an objective lens, a deflection scanning device and a signal-electrons detector. The beam-limit aperture limits the current of the PE beam to a desired value and the PE beam then is focused by the objective lens onto the observed surface S11 of the specimen S1. The signal-electrons detector detects the signal electrons emitted from the surface due to the illumination of the focused PE-beam, which comprise secondary electrons (energy<50 eV) and/or backscattered electrons and are related to topography, material and charge-up situation of the surface S11. The deflection scanning device deflects the focused PE beam to scan the surface S11 so that an image of the observed surface S11 can be obtained. The focused PE beam is normal or substantially normal to the observed surface during the scanning. The image may comprise topography contrast, material contrast and voltage contrast (due to charge-up) simultaneously or individually. Therefore, the interested features (such as physical and electric defects and foreign particles) on the surface can be observed in the image.

In the imaging system of each sub-column, the objective lens may be a pure magnetic objective lens or an electromagnetic compound objective lens (including a magnetic objective lens and an electrostatic objective lens). The magnetic objective lenses of all the sub-columns are formed by the multi-axis magnetic objective lens M1. In other words, the magnetic objective lens of each sub-column is one magnetic sub-lens of the multi-axis magnetic objective lens M1. For each sub-column, the structure of the magnetic objective lens thereof is determined in terms of the function which the sub-column is required to perform. For the sub-columns performing the same or similar functions, the magnetic objective lenses thereof will be same or similar; while for the sub-columns performing different functions, the magnetic objective lenses thereof will be obviously different. Therefore, different from the multi-axis magnetic lenses proposed in U.S. Pat. Nos. 8,003,953, 8,294,095 and 8,445,862 and the cross reference, all the magnetic sub-lenses of the multi-axis magnetic objective lens M1 will not be the same. Some of the magnetic sub-lenses may be same or similar to each other and the others may be different. For example, both the sub-columns A1-S1 and A1-Sn perform high-throughput inspection and the sub-column A1-S2 performs high-resolution review, and therefore the corresponding magnetic sub-lenses of the sub-columns A1-S1 and A1-Sn will be same or similar to each other and different from that of the sub-column A1-S2.

FIGS. 4A and 4C-4E respectively show one embodiment of the apparatus A1. For the sake of clarity, only two sub-columns are shown in each embodiment. However, it would be recognized that the apparatus A1 can have more than two sub-columns, and sub-columns shown in FIGS. 4A and 4C-4E can together exist in the apparatus A1. In addition, the multi-axis magnetic objective lens M1 can comprise more than two magnetic sub-lenses same or different in structure. Although the number of sub-lenses is free to be increased, it is better to locate every new sub-lens with the least increasing of the geometric structure's asymmetry of the multi-axis magnetic objective lens M1.

The embodiment 1000-1 of the apparatus A1, as shown in FIG. 4A, comprises two sub-columns 1100 and 1200 for two similar functions. Both perform high-throughput inspection but the sub-column 1100 more emphasizes throughput and the sub-column 1200 more emphasizes resolution. Therefore the sub-columns 1100 and 1200 both have a basic configuration similar to that of a conventional single-beam inspection tool. For example, in the sub-column 1100, the electron gun unit comprises the electron source 1101 and the condenser lens 1102. The electron source 1101 at least comprises a cathode, an anode and a gun aperture. The condenser lens 1102 can be an electrostatic lens or one magnetic sub-lens of a multi-axis magnetic lens. The imaging system and the electron gun unit are separated by the vacuum gate valve 1111. The imaging system comprises five members, wherein the first member is the beam-limit aperture 1121, the second member is the signal-electrons detector 1131, the third member is the deflection scanning device formed by the deflectors 1161 and 1162, the fourth member is the magnetic objective sub-lens formed by the upper and lower pole-pieces 1141 and 1142, and the five member is the electrostatic objective lens formed by the lower pole-piece 1142, the control electrode 1151 and the observed surface S11 of the specimen S1. The control electrode 1151 is biased with respect to the observed surface S11 so as to control the electrostatic field thereon. The magnetic-shielding tubes 1171-1173 reduce the magnetic field on the primary beam path between the cathode and the upper pole-piece, and the outer magnetic-shielding tube 53 and top magnetic-shielding plate 54 further reduce the magnetic field leaked onto the primary beam path of each sub-column through the spatial gaps between the magnetic-shielding tubes.

Due to the difference in function, the sub-columns 1100 and 1120 are different in structure of magnetic objective lens and layout of deflection scanning device. To emphasize throughput, the sub-column 1100 needs to provide a large field of view (FOV) but not sacrifice resolution to a certain degree. Accordingly, the magnetic-circuit gap formed by the upper and lower pole-pieces 1141 and 1142 is only slightly oriented away from the optical axis 1190 so as to form a slight-immersion magnetic sub-lens inside the multi-axis magnetic objective lens M1, and the lower deflector 1162 is placed inside the magnetic-circuit gap so as to form swing deflection (refers to Chen in U.S. Pat. No. 6,392,231). To emphasize resolution, the sub-column 1200 needs to provide a high resolution but not sacrifice FOV to a certain degree. Accordingly, the magnetic-circuit gap formed by the upper and lower pole-pieces 1241 and 1242 is obviously oriented away from the optical axis 1290 and close to the specimen S1 so as to form a deep-immersion magnetic sub-lens inside the multi-axis magnetic objective lens M1, and the lower deflector 1262 is placed close to the magnetic-circuit gap so as to form swing deflection as much as possible. To immerse the specimen S1 as much as possible so as to reduce geometric aberrations, the control electrode 1251 is placed inside the lower pole-piece 1242 to enable the magnetic-circuit gap further close to the specimen S1. The required excitations of the magnetic sub-lenses in the sub-columns 1100 and 1200 will not always happen to be same. For example, the magnetic sub-lenses in the sub-columns 1100 and 1200 need 1001AT and 1010AT respectively. In this case, the common coil can be set to provide 1000AT and the rest can be provided by the sub-coils 1181 and 1282 respectively winding around the upper pole-pieces 1141 and 1241.

Because the radial gap formed between a hole and a magnetic ring can dramatically weaken the non-axisymmetric distribution of magnetic scalar potential inside the magnetic ring, the shape of the multi-axis magnetic objective lens M1 is not necessary in a circular shape and can be any shape. However, it is better to keep n-order rotation symmetry and/or n-fold symmetry as much as possible. FIG. 4B shows the A-A section in FIG. 4A, where the shape of the multi-axis magnetic objective lens M1 is a rectangular with two half-circle sides. Compared with a circular one, this one takes less space and generates less heat due to a shorter length of the common coil 44.

In the embodiment 1000-2 of the apparatus A1, which is shown in FIG. 4C, the sub-column 1300 can perform high-throughput inspection with very large beam current and very large FOV, such as inspecting features with large dimensions. In this case, balancing off-axis aberrations and impact of electron interactions is a main issue. Consequently, the magnetic sub-lens is far away from the specimen S1. The long distance between the pole-piece 1341 and the specimen S1 makes it possible to place one more signal-electrons detector 1332 to effectively detect back-scattered electrons from the specimen surface S11. Certainly, the electron detector 1332 can also be used to control the electrostatic field on the observed surface S11. Furthermore, the magnetic ring in the lower hole can be removed for the sake of simplification in manufacturing because the residual non-axisymmetric transverse field components do not dominantly deteriorate the image resolution.

FIG. 4D shows another embodiment of the apparatus A1. In FIG. 4D, the embodiment 1000-3 comprises two sub-columns for high-resolution review. To obtain high imaging resolution in the sub-column 1400, the upper and lower pole-pieces 1441 and 1442 form a radial magnetic-circuit gap 1443 very close to the specimen S1. The magnetic field leaked through the radial magnetic-circuit gap 1443 deeply immerses the specimen S1. The deeper the magnetic immersion, the smaller the geometric aberrations. In addition, one more magnetic-shielding tube 1474 is located to overlap with the top end of the magnetic-shielding tube 1473 from inside, which is especially designed to fully cover the cathode. A small deviation of an electron trajectory generated by the residual dipole field in the area near the electron source will be magnified by the following system to a big landing position deviation and large additional off-axis aberrations on the specimen surface. In the sub-column 1700, the magnetic ring in the lower hole is removed for the simplification in manufacture. Because the residual non-axisymmetric transverse field components in this case will be larger than in the sub-column 1400, the image resolution of the sub-column 1700 will be lower than that of the sub-column 1400.

Observing certain features on the surface of a specimen may require a sub-column to provide images formed by signal electrons with energies higher than a specific value. For this application, a sub-column with one energy-discrimination detection is needed. FIG. 4E shows another embodiment of the apparatus A1 with such a sub-column. In FIG. 4E, compared with the sub-column 1400 for conventional high-resolution review, the sub-column 1500 additionally comprises an energy-filter 1531EF placed in front of the signal-electrons detector 1531 and a Wien filter (or called ExB) 1563 placed between the energy filter 1531EF and the specimen S1. The signal-electrons detector 1531 is placed off the optical axis 1590. The Wien filter 1563 deflects the signal-electrons beam 1592 to enter the energy-filter 1531EF. The energy-filter 1531EF is adjusted such that only the signal electrons with energies higher than a desired value can pass through the energy filter 1531EF and be detected by the signal-electrons detector 1531. When the energy-filter 1531EF is turned off, the signal-electrons detector 1531 can provide the imaging signal for conventional high-resolution review. However, the imaging signal will be a little weak due to the filter grids of the energy-filter 1531EF will cut off a part of the signal electrons. To solve this issue, the sub-column 1500 can comprises one more signal-electrons detector 1533. In this case, the Wien filter 1563 deflects the secondary electron beam 1592 to enter the secondary detector 1533 when the energy-discrimination detection is not required.

Returning back to FIG. 4C, the embodiment 1000-2 of the apparatus A1 also comprises one sub-column 1600 for charge-up control. In the sub-column 1600, the gun aperture 1601_3 is set to provide a large current of the PE beam. The condenser lens 1602 adjusts the PE beam so that the beam current after the beam-limit aperture 1621 can be changed in a large range. The charge-up control for the specimen surface can be done with an illumination of a wide PE beam (in this case the scanning deflector 1661 shown here can be removed) or with deflection scanning of a focused PE beam (as shown here). The scanning deflector 1661 can be inside or above the magnetic-circuit gap (as shown). The landing energy of the PE beam on the specimen surface S11 can be changed by changing the voltage of the cathode or the voltage of the specimen S1.

Same as the apparatus A1, each sub-column in the apparatus A2 works on the fundamental of scanning electron microscopy and thereby having a configuration same as an sub-column in the apparatus A1. Different from the apparatus A1, at least one sub-column in the apparatus A2 uses an oblique illumination. In FIGS. 5A and 5B, each of all the sub-columns (A2-S1, A2-S2 to A2-Sn) has a gun unit (such as A2-S1-1) and an imaging system (such as A2-S1-2). The magnetic objective lens of each imaging system is formed by one magnetic sub-lens of the multi-axis magnetic objective lens M2. There are two sub-columns A2-S1 and A2-S2 with normal illumination and one sub-column A2-Sn with an oblique illumination. In FIGS. 5A and 5B, the optical axis A2-Sn-0 of the sub-column A2-Sn is tilted in YZ plane and XZ plane respectively to form an angle α1 and α2 with respect to the normal of the observed surface S11 of the specimen S1 sustained by the specimen stage S2.

Accordingly, in the apparatus A2, at least one of the sub-columns can perform high-throughput inspection of interested features on the surface of the specimen, and at least one of the sub-columns can do high-resolution review of interested features on the surface of the specimen. Furthermore, it is preferred that at least one of the sub-columns can specially be configured to perform the auxiliary function, i.e. the charge-up control function mentioned above, to control the charge-up situation of the local area of the specimen surface before or after an observation so as to get a better image contrast or resolution. The sub-columns performing high-throughput inspection, high-resolution review and charge-up control can be with either normal illumination or an oblique illumination.

FIGS. 6A-6C respectively show one embodiment of the apparatus A2. For the sake of clarity, only two sub-columns are shown in each embodiment. However, it would be recognized that the apparatus A2 can have more than two sub-columns Any sub-column in the apparatus A1 shown in FIGS. 4A and 4C-4F can be used in the apparatus A2 as a sub-column with normal illumination or an oblique illumination. In addition, the multi-axis magnetic objective lens M2 can comprises more than two magnetic sub-lenses same or different in structure. Although the number of sub-lenses is free to be increased, it is better to locate every new sub-lens with the least increasing of the geometric structure's asymmetry of the multi-axis magnetic objective lens M2.

In the embodiment 2000-1 of the apparatus A2, as shown in FIG. 6A, two sub-columns 2100 and 2200 are for high-throughput inspection respectively in normal illumination and oblique illumination. The sub-column 2100 is same as the sub-column 1100 in FIG. 4A, and the sub-column 2200 is similar to 2100 but tilted an angle with respect to Z axis in YZ plane. In the embodiment 2000-2 of the apparatus A2, as shown in FIG. 6B, the sub-columns 2300 is similar to 2100 but tilted an angle with respect to Z axis in XZ plane for high-throughput inspection in oblique illumination. In the embodiment 2000-3 of the apparatus A2, as shown in FIG. 6C, the sub-column 2400 has a function similar to the sub-column 1300 in FIG. 4C but with an oblique illumination. The function is high-throughput inspection with very large beam current and very large FOV, such as inspecting features with large dimensions. In the sub-column 2400, the upper signal-electrons detector 2431 and lower signal-electrons detector 2432 are used to detect secondary electrons (energy<50 eV) and back-scattered electrons respectively.

In summary this invention provides an apparatus of charged particle beam with multi-functions required for observing a surface of a specimen, such as both high-throughput inspection and high-resolution review of interested features on the specimen surface. The apparatus employs a plurality of charged particle beams and a multi-axis magnetic objective lens to form multiple sub-columns respectively performing one of the multi-functions. Some of the sub-columns can perform same or similar functions. Each sub-column works on the principle of scanning electron microscope. Some of the sub-columns can work with normal illumination and the others can respectively work with an oblique illumination. In semiconductor manufacturing, the apparatus can perform the functions of defect/particle inspection and defect/particle review for yield management of wafer/mask. Compared with the conventional way for the yield management, wherein each of the multi-functions is realized in an individual single-function apparatus, a single apparatus with multi-functions can provide a much higher throughput with a much lower cost.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus of plural charged particle beams, comprising:
    a specimen stage, which sustains a specimen thereon; and
    multiple sub-columns, which are placed above an observed surface of said specimen and respectively perform one of multiple functions for observing said observed surface,
    wherein a first function of said multiple functions is high-throughput inspection of interested features on said observed surface, and a second function of said multiple functions is high-resolution review of said interested features on said observed surface,
    wherein each of said multiple sub-columns comprises:
        a gun unit, which comprises a charged particle source and a condenser lens to provide a primary charged particle beam along an optical axis of said each sub-column; and
        an imaging system, which comprises a beam-limit aperture, an objective lens, a deflection scanning device and a first charged-particle detector, wherein said beam-limit aperture and said objective lens are aligned with said optical axis, said beam-limit aperture limits a current of said primary charged particle beam to a desired value, said objective lens focuses said primary charged particle beam onto said observed surface, said first charged-particle detector detects secondary charged particles emitted from said observed surface where said primary charged particle beam impinges, and said deflection scanning device deflects said primary charged particle beam to scan said observed surface so that an image of said observed surface can be obtained,
    wherein said objective lens comprises a magnetic objective lens,
    wherein said magnetic objective lenses of said multiple sub-columns are formed by a multi-axis magnetic objective lens which comprises:
        an upper magnetic conductor plate with multiple upper through holes and a lower magnetic conductor plate with multiple lower through round holes, both of which are parallel to each other, wherein each of said multiple upper through holes is aligned with one of said multiple lower through round holes and both are aligned with said optical axis of one of said multiple sub-columns and form a pair of through holes,
        multiple upper magnetic round rings, which are respectively inside and aligned with upper through holes of said pairs of through holes with first radial gaps therebetween, and extend downward through inside said lower through round holes of said pairs of through holes to form first non-magnetic gaps therebetween, wherein said first radial gaps can be vacuum or filled of non-magnetic or weakly-magnetic material, and
        a common excitation coil located between said upper magnetic conductor plate and said lower magnetic conductor plate to provide a common magnetic flux, thereby forming multiple magnetic objective sub-lenses respectively configured by said multiple pairs of through holes and said upper magnetic round rings therein, wherein said first non-magnetic gaps perform as magnetic-circuit gaps of said multiple magnetic objective sub-lenses respectively,
    wherein each of said magnetic objective lenses is one of said multiple magnetic objective sub-lenses, and said magnetic objective sub-lenses inside said sub-columns performing different functions are different in geometric shape.

2. The apparatus of plural charged particle beams according to claim 1, wherein each said charged particle source is an electron source of field emission, said primary charged particle beam is a primary electron beam formed by electrons emitted from said electron source, and said secondary charged particles are secondary electrons and backscattered electrons both generated by said primary electron beam from said observed surface of said specimen.

3. The apparatus of plural charged particle beams according to claim 2, wherein inside one of sub-columns, said magnetic objective sub-lens further comprises a first sub-coil winding around said upper magnetic round ring so that said magnetic field of said magnetic objective sub-lens can be adjusted individually.

4. The apparatus of plural charged particle beams according to claim 3, wherein inside each of said sub-columns, said imaging system further comprises a control electrode which is below said upper magnetic round ring and aligned with said optical axis so as to control an electrostatic field on said observed surface.

5. The apparatus of plural charged particle beams according to claim 4, wherein for one of sub-columns, said control electrode also functions as a second signal-electrons detector to detect said backscattered electrons with large emission angles.

6. The apparatus of plural charged particle beams according to claim 4, wherein inside one of sub-columns, said magnetic objective sub-lens further comprises a lower magnetic round ring inside and aligned with said lower round hole with a second radial gap, wherein said lower magnetic round ring encircles said upper magnetic round ring to form a second non-magnetic gap therebetween which performs as said magnetic-circuit gap of said magnetic objective sub-lens.

7. The apparatus of plural charged particle beams according to claim 6, wherein said second radial gap can be vacuum or filled of non-magnetic or weakly-magnetic material.

8. The apparatus of plural charged particle beams according to claim 7, wherein inside said sub-column, said control electrode also functions as a third signal-electrons detector to detect said backscattered electrons with large emission angles.

9. The apparatus of plural charged particle beams according to claim 7, wherein said optical axis of said sub-column is oblique with respect to the normal of said observed surface.

10. The apparatus of plural charged particle beams according to claim 8, wherein said optical axis of said sub-column is oblique with respect to the normal of said observed surface.

11. The apparatus of plural charged particle beams according to claim 7, wherein said second non-magnetic gap is so shaped that a magnetic field of said magnetic objective sub-lens deeply immerse said observed surface.

12. The apparatus of plural charged particle beams according to claim 11, wherein said first charged-particle detector is placed off said optical axis of said sub-column.

13. The apparatus of plural charged particle beams according to claim 12, wherein said sub-column further comprises an energy filter placed in front of said first charged-particle detector so as to make said secondary charged particles with energies higher than a desired value be detected by said first charged-particle detector.

14. The apparatus of plural charged particle beams according to claim 13, wherein said sub-column further comprises a Wien filter so as to deflect said secondary charged particles to enter said energy filter with desired incident angles and without deflecting said primary electron beam.

15. The apparatus of plural charged particle beams according to claim 1, further comprising one charge-up-control sub-column to perform a charge-up control function for said observed surface so as to enhance image contrast or resolution when performing said first function and/or said second function.

16. The apparatus of plural charged particle beams according to claim 15, wherein said charge-up-control sub-column comprising:
 a charge-up-control gun unit, which comprises a charge-up-control charged particle source and a charge-up-control condenser lens to provide a charge-up-control primary charged particle beam along an optical axis of said charge-up-control sub-column; and
 a charge-up-control imaging system, which comprises a charge-up-control beam-limit aperture and a charge-up-control magnetic objective lens both aligned with said optical axis of said charge-up-control sub-column to focus said charge-up-control primary charged particle beam to illuminate said observed surface,
 wherein said charge-up-control magnetic objective lens is formed by one of said magnetic objective sub-lenses of said multi-axis magnetic objective lens and a second sub-coil, wherein said second sub-coil is winded around said upper magnetic round ring of said magnetic objective sub-lens so that a magnetic field thereof can be adjusted individually.

17. The apparatus of plural charged particle beams according to claim 16, wherein inside said charge-up-control sub-column, said charge-up-control imaging system further comprises a charge-up-control deflection scanning device which deflects said charge-up-control primary charged particle beam to scan said observed surface.

18. The apparatus of plural charged particle beams according to claim 16, wherein inside said charge-up-control sub-column, said magnetic objective sub-lens further comprises a lower magnetic round ring which is inside and aligned with said lower round hole with a third radial gap and encircles said upper magnetic round ring to form a third non-magnetic gap therebetween performing said magnetic-circuit gap of said magnetic objective sub-lens.

19. A method to configure an apparatus with multiple functions for observing a surface of a specimen, comprising
 providing a stage to sustain said specimen; and
 providing a plurality of charged particle beams and a multi-axis magnetic objective lens to form multiple sub-columns respectively facing said surface of said specimen to perform one of said multiple functions,
 wherein a first function of said multiple functions is high-throughput inspection of interested features on said surface, and a second function of said multiple functions is high-resolution review of said interested features on said surface,
 wherein said multi-axis magnetic objective lens comprises a pair of parallel magnetic conductor plates with multiple through holes in pairs, a plurality of magnetic round rings in pairs respectively inside said multiple pairs of through holes with radial gaps and forming magnetic-circuit gaps therebetween, a plurality of sub-coils each winding around one magnetic round ring of one of said pairs of magnetic round rings and a common excitation coil located between said pair of parallel magnetic conductor plates so as to form multiple magnetic objective sub-lenses individually adjustable and thereby respectively functioning as magnetic objective lenses of said multiple sub-columns,
 wherein said magnetic objective sub-lenses inside said sub-columns performing different functions are different in geometric shape,
 wherein said radial gaps can be vacuum or filled of non-magnetic or weakly-magnetic material.

20. The method to configure an apparatus with multiple functions for observing a surface of a specimen according to claim 19, wherein one of said multiple sub-columns employs normal illumination.

21. The method to configure an apparatus with multiple functions for observing a surface of a specimen according to claim 20, wherein one of said multiple sub-columns employs an oblique illumination.

22. The method to configure an apparatus with multiple functions for observing a surface of a specimen according to claim 19, further providing a charge-up-control charged particle beam to form a charge-up-control sub-column with said multi-axis magnetic objective lens.

23. The method to configure an apparatus with multiple functions for observing a surface of a specimen according to claim 22, wherein said charge-up-control sub-column performs a charge-up control function for said surface so as to enhance image contrast or resolution when performing said first function and said second function.

24. The method to configure an apparatus with multiple functions for observing a surface of a specimen according to claim 19, wherein said multiple sub-columns can work simultaneously or in a programmed series.

* * * * *